(12) United States Patent
Chiang et al.

(10) Patent No.: US 8,951,699 B2
(45) Date of Patent: Feb. 10, 2015

(54) ADJUSTABLE PHOTO-MASK

(71) Applicant: National Kaohsiung University of Applied Sciences, Kaohsiung (TW)

(72) Inventors: Chia-Chin Chiang, Kaohsiung (TW); Chien-Chia Tseng, Keelung (TW)

(73) Assignee: National Kaohsiung University of Applied Science, Kaohsiung (TW)

( * ) Notice: Subject to any disclaimer, the term of this patent is extended or adjusted under 35 U.S.C. 154(b) by 92 days.

(21) Appl. No.: 13/786,557

(22) Filed: Mar. 6, 2013

(65) Prior Publication Data

US 2014/0205935 A1 Jul. 24, 2014

(30) Foreign Application Priority Data

Jan. 21, 2013 (TW) .............................. 102102237 A

(51) Int. Cl.
*G03F 1/14* (2006.01)
*G03F 1/00* (2012.01)

(52) U.S. Cl.
CPC ...................................... *G03F 1/14* (2013.01)
USPC .............................................. 430/5; 216/41

(58) Field of Classification Search
CPC .............................. G03F 1/14; G23C 14/042
USPC ......................................... 430/5, 394; 216/41
See application file for complete search history.

(56) References Cited

U.S. PATENT DOCUMENTS

| 7,935,459 | B2 | 5/2011 | Gaylord et al. |
| 8,021,805 | B2 | 9/2011 | Oh et al. |
| 2007/0017895 | A1* | 1/2007 | Yotsuya et al. ................. 216/41 |

* cited by examiner

*Primary Examiner* — Stephen Rosasco
(74) *Attorney, Agent, or Firm* — Alan D. Kamrath; Kamrath IP Lawfirm, P.A.

(57) ABSTRACT

An adjustable photo-mask for providing variable properties includes a casing and a plate. The casing has a receiving room inside and a plurality of openings, with the openings extending from the receiving room to a front face of the casing. The plate has a plurality of through holes, with an axial direction of the through holes defined as a ray-transmission direction, with the plate slideably received in the receiving room, and with the through holes and the openings totally or partially overlapping in the ray-transmission direction.

5 Claims, 19 Drawing Sheets

ADJUSTABLE PHOTO-MASK

BACKGROUND OF THE INVENTION

1. Field of the Invention

The present invention generally relates to a photo-mask and, more particularly, to an adjustable photo-mask for adjustment in etching performance.

2. Description of the Related Art

Referring to FIGS. 1 and 2, a conventional photo-mask is formed by a metal casing 9 with a plurality of rectangular holes 91 penetratingly arranged in a top wall of the metal casing 9 and forming an array. Rays can enter an inner room of the metal casing 9 via the rectangular holes 91 to illustrate a workpiece "W," such as a fiber, inside the inner room to form exposed and unexposed regions and etch the exposed regions. However, since the metal casing 9 is rigid and since the size of the rectangular holes 91 is fixed and impossible to be changed after the rectangular holes 91 are formed, properties of the conventional photo-mask are previously determined and not adjustable. As a result, a manufacturer has to prepare a plurality of the conventional photo-masks with different sizes of the rectangular holes 91 or with different spaces between any two adjacent rectangular holes 91. Thus, not only the cost in manufacture is unable to be lowered, but also it is inconvenient to perform the etching process when the properties have to be changed. An immediate change in properties cannot be achieved, either. As a result, it is necessary to improve the conventional photo-mask.

SUMMARY OF THE INVENTION

It is therefore the objective of this invention to provide an adjustable photo-mask able to form variable exposed and unexposed regions of the workpieces by changing properties of cycle length or open area ratio for various needs.

One embodiment of the invention discloses an adjustable photo-mask, which includes a casing and a plate. The casing has a receiving room inside and a plurality of openings, with the openings extending from the receiving room to a front face of the casing. The plate has a plurality of through holes, with an axial direction of the through holes defined as a ray-transmission direction, with the plate slideably received in the receiving room, and with the through holes and the openings totally or partially overlapping in the ray-transmission direction.

In a preferred form shown, at least one positioning portion is formed in an inner surface of the receiving room of the casing, with the inner surface facing the openings.

In the preferred form shown, a number of the at least one positioning portion is plural, with each positioning portion being a groove formed in the inner surface and extending from one passage of the casing to another passage thereof in a longitudinal direction.

In the preferred form shown, each of the openings extends along the front face in a cross direction and across the positioning portions.

In the preferred form shown, the openings are arranged in an array formation while a part of the openings arranged along the longitudinal direction through which a single positioning portion extends across is defined as in one group.

In the preferred form shown, a plurality of groups of the openings is defined, widths in the longitudinal direction of the openings in different groups are different, and the through holes are arranged corresponding to the openings and capable of aligning with the openings in the ray-transmission direction.

In the preferred form shown, different groups of the openings have different cycle lengths.

In another preferred form shown, the receiving room forms two opposite passages on two lateral sides of the casing respectively, and a face of the plate facing the openings has a scale.

Another embodiment of the invention discloses an adjustable photo-mask, which includes a casing and a plate. The casing has a base and a cover. The base has a depression and a first coupling member, and the cover has a plurality of openings and a second coupling member, with the openings penetrating the cover, and with the second coupling member rotatably coupling with the first coupling member for the cover to cover the depression or to reveal the depression. The plate has a plurality of through holes, with an axial direction of the through holes defined as a ray-transmission direction, with the plate being slideably received in the depression, and with the through holes and the openings totally or partially overlapping in the ray-transmission direction.

In a preferred form shown, at least one positioning portion is formed in an inner-bottom surface of the depression.

In another preferred form shown, the depression forms two opposite passages on two lateral sides of the base respectively, the first coupling member is formed on one of the two lateral sides of the base, and the coupling member is formed at a side of the cover.

In a further preferred form shown, the cover has at least one limit member able to rest on a top of the base.

A further embodiment of the invention discloses an adjustable photo-mask, which includes a casing and a plate. The casing has a receiving room inside and a plurality of openings, A part of the openings extends from the receiving room to a first face, and the other part of the openings extends from the receiving room to a second face substantially opposite to the first face. An axial direction of the openings is defined as a ray-transmission direction. The plate has two side frames and a plurality of shading bars. The side frames are arranged in parallel, and each of the side frames has a first surface and a second surface. A part of the shading bars links the first surfaces of the two side frames, and the other part of the shading bars links the second surfaces of the two side frames to form an insertion space between the two parts of the shading bars. The shading bars arranged on a same side of the side frames are spaced to form a through hole between any adjacent two of the shading bars and communicating with the insertion space, the plate is slideably received in the receiving room, and the through holes and the openings totally or partially overlap in the ray-transmission direction.

In a preferred form shown, the receiving room forms two opposite passages on two lateral sides of the casing respectively.

In another preferred form shown, at least one of the side frames has scales on the first and second surfaces.

In a further preferred form shown, each of the shading bars has two pivotal members respectively forming two ends thereof. The part of the shading bars rotatably links the first surfaces of the two side frames via the pivotal members thereof, and the other part of the shading bars rotatably links the second surfaces of the two side frames via the pivotal members thereof.

Another embodiment of the invention discloses an adjustable photo-mask, which includes a casing and a plate. The casing has a base and a cover. Both of the base and the cover have a plurality of openings penetrating the base or the cover, and an axial direction of the openings of the base is defined as a ray-transmission direction. The base further has a depression and a first coupling member, and the cover further has a second coupling member rotatably coupling with the first coupling member for the cover to cover the depression or to reveal the depression. The plate has two side frames and a plurality of shading bars. The side frames are arranged in parallel, and each of the side frames has a first surface and a second surface. A part of the shading bars links the first surfaces of the two side frames, and the other part of the shading bars links the second surfaces of the two side frames to form an insertion space between the two parts of the shading bars. The shading bars arranged on a same side of the side frames are spaced to form a through hole between any adjacent two of the shading bars and communicating with the insertion space, the plate is slideably received in the receiving room, and the through holes and the openings totally or partially overlap in the ray-transmission direction.

In a preferred form shown, the depression forms two opposite passages on two lateral sides of the base respectively, the first coupling member is formed on one of the two lateral sides of the base, and the coupling member is formed at a side of the cover.

In another preferred form shown, the cover has at least one limit member able to rest on a top of the base.

In a further preferred form shown, at least one of the side frames has scales on the first and second surfaces.

In another preferred form shown, each of the shading bars has two pivotal members respectively forming two ends thereof, the part of the shading bars rotatably links the first surfaces of the two side frames via the pivotal members thereof, and the other part of the shading bars rotatably links the second surfaces of the two side frames via the pivotal members thereof.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
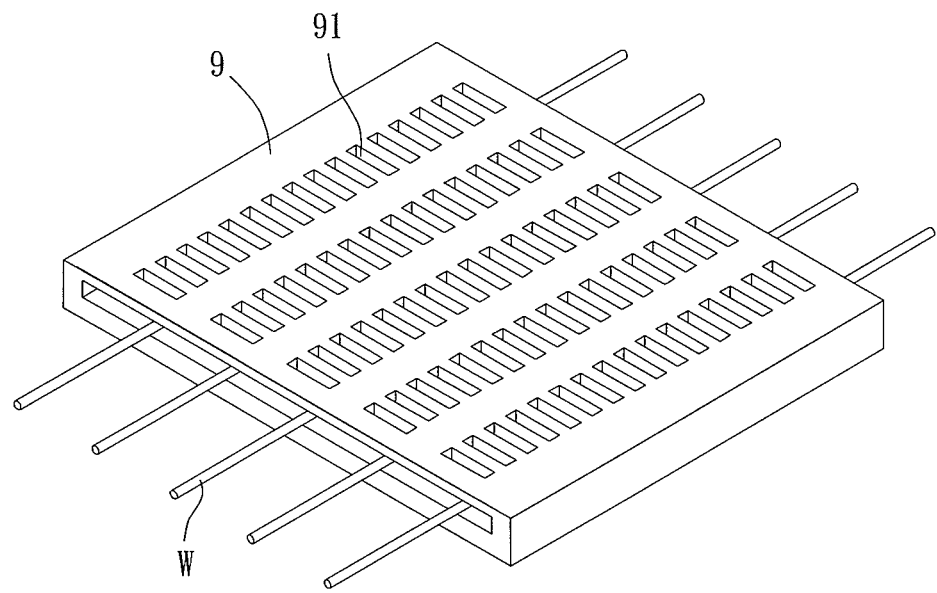
FIG. 1 is a perspective view of a conventional photo-mask.
Figure 2:
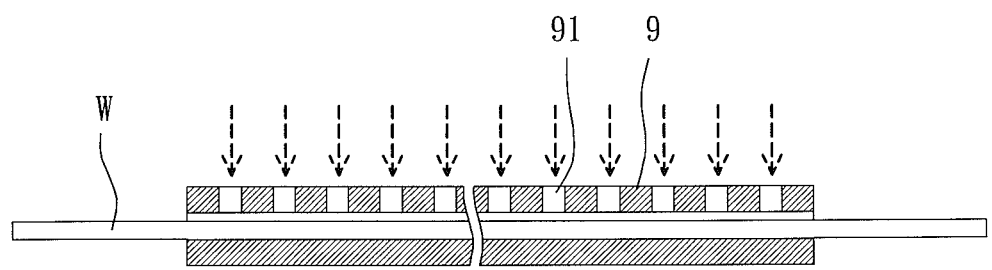
FIG. 2 is a cross-sectional view of the conventional photo-mask.

In the various figures of the drawings, the same numerals designate the same or similar parts. Furthermore, when the terms "first," "second," "third," "fourth," "fifth," "top," "bottom," and similar terms are used hereinafter, it should be understood that these terms refer only to the structure shown in the drawings as it would appear to a person viewing the drawings, and are utilized only to facilitate describing the invention.

DETAILED DESCRIPTION OF THE INVENTION

Figure 3:
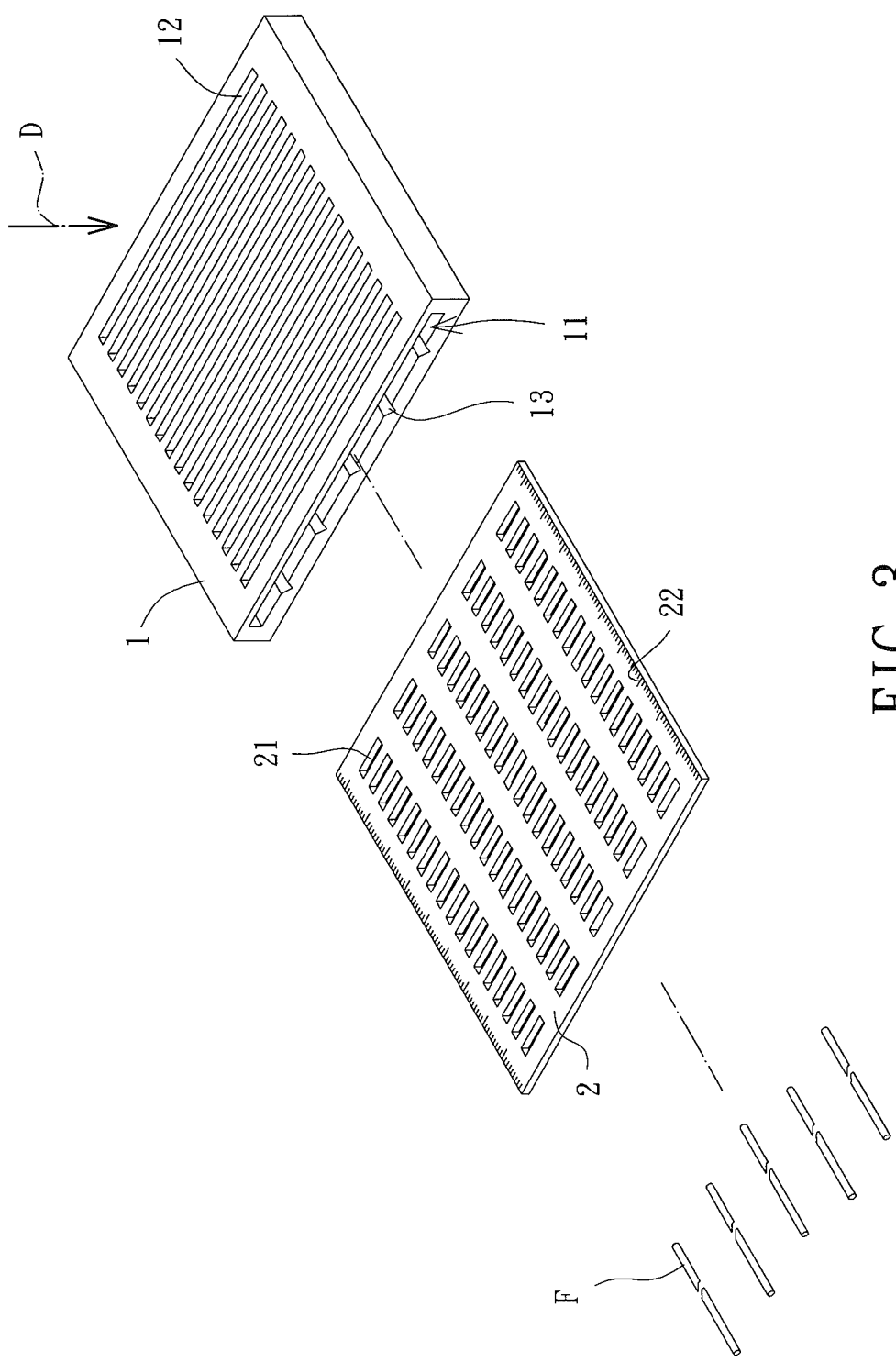
FIG. 3 is a perspective and exploded view of an adjustable photo-mask according to a first embodiment of the invention.

Referring to FIG. 3, a first embodiment of an adjustable photo-mask of the present invention is shown, which includes a hollow casing 1 and a plate 2. The casing 1 and the plate 2 are made of metal or macromolecular material, which have low swell factors. The casing 1 receives the plate 2 and is adapted to receive workpieces at the same time, and the plate 2 is able to be shifted relatively to the casing 1. Accordingly, properties of the adjustable photo-mask can be changed to provide variable exposed and unexposed regions of the workpieces. Specifically, the properties include a "cycle length" and an "open area ratio," the cycle length equals the total distance of an exposed region and an unexposed region abutting against the exposed region in a longitudinal direction, and the open area ratio equals a ratio of the length of the exposed region to the cycle length. Therefore, the provided adjustable photo-mask is suitable for an etching process in manufacture of etched products such as long-period and short-period fiber sensors. In order to clearly illustrate the embodiments of the present invention, fibers "F" serve as the workpieces in the following illustration, but the workpieces are not limited thereby.

Referring to FIG. 3 again, there is a receiving room 11 formed inside the hollow casing 1, with the receiving room 11 preferably forming two opposite passages on two lateral sides of the casing 1 respectively. The lateral sides are spaced in the longitudinal direction, and, thus, the plate 2 can be inserted into the receiving room 11 via the passages and freely slide longitudinally. The casing 1 further includes a plurality of openings 12 extending from the receiving room 11 to a front face between the two lateral sides, so that rays illustrating onto the front face can enter the receiving room 11 by passing through the openings 12. Specifically, the openings 12 are preferably spaced in the longitudinal direction.

Additionally, there is at least one positioning portion 13 of the casing 1 formed in an inner surface of the receiving room 11 for the fibers "F" to be firmly fixed in predetermined positions in the receiving room 11 thereby, to ensure that the etching process toward the fibers "F" can be accurately performed on predetermined positions. In this embodiment, each positioning portion 13 is a groove formed in the inner surface and extending in the longitudinal direction from one of the opposite passages to the other one of them, with the inner surface facing the openings 12. Furthermore, in order to have a desirable efficiency in manufacture, the number of the at least one positioning portion 13 is plural for a plurality of fibers "F" to pass through the receiving room 11 in the longitudinal direction and to be etched at the same time.

Preferably, if there are plural positioning portions 13 in the casing 1, the positioning portions 13 are spaced in a cross direction perpendicular to the longitudinal direction, Each opening 12 extends along the front face in the cross direction and across the positioning portions 13, which is therefore easy to be formed and leads to a simple structure of the front face. However, referring to FIG. 6a, in order to provide a preferable structural strength for an ideal lifetime of the present adjustable photo-mask, the arrangement of the openings 12 can also be in an array formation, while a part of the openings 12 arranged along the longitudinal direction through which a single positioning portion 13 extends across is defined as in one group 121.

Referring to FIG. 3 again, the plate 2 has a plurality of through holes 21, an axial direction of the through holes 21 is defined as a ray-transmission direction "D," and a face of the plate 2 having these through holes 21 faces the openings 12 of the casing 1. Since the plate 2 is slideably received in the receiving room 11 for the through holes 21 and the openings 12 to totally or partially overlap in the ray-transmission direction "D," the ray passing through the openings 12 into the receiving room 11 can go across the through holes 21 toward the fibers "F." Moreover, the face of the plate 2 facing the openings 12 can have a scale 22 provided in the longitudinal direction for showing the position relationship between the plate 2 and the casing 1 and for immediately determining the amount of slide of the plate 2.

Figure 4A:
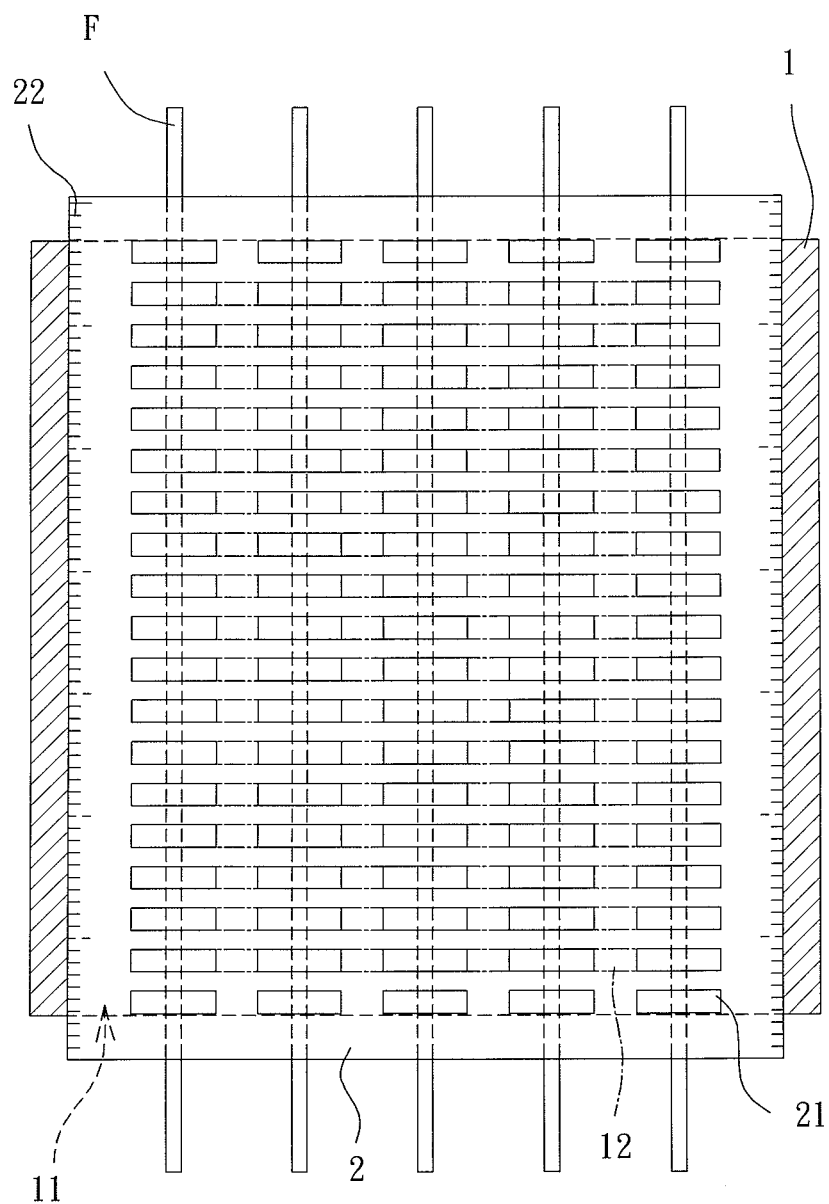
FIG. 4a is a top view of the adjustable photo-mask according to the first embodiment in a first use mode.
Figure 4B:
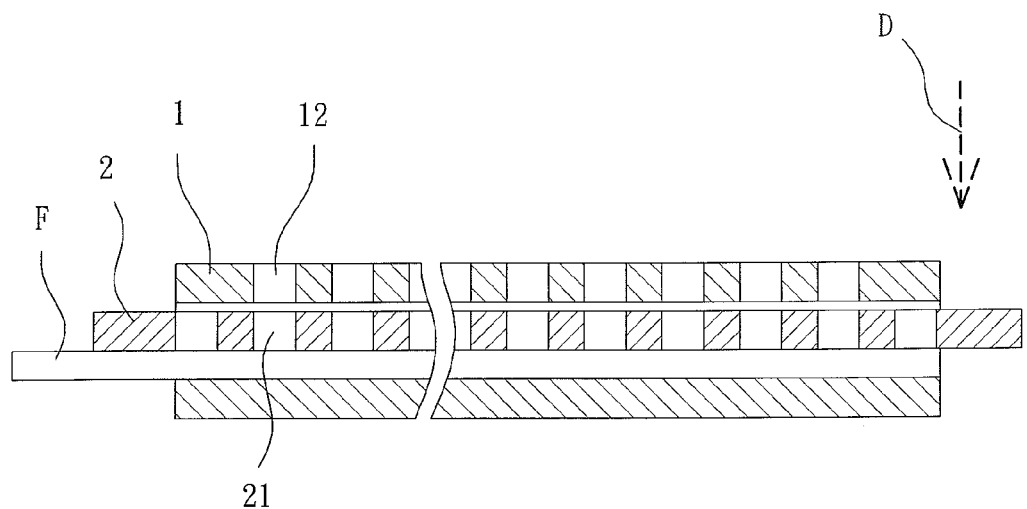
FIG. 4b is a cross-sectional view of the adjustable photo-mask according to the first embodiment in the first use mode.
Figure 4C:
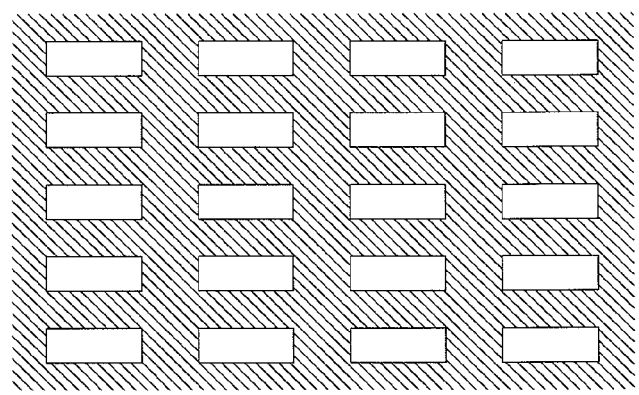
FIG. 4c is a top view of a shading performance of the adjustable photo-mask according to the first embodiment in the first use mode.

Referring to FIGS. 3 and 4a through 4c now, in a "first use mode" with the plate 2 in a position for the plural through holes 21 and the openings 12 to totally overlap in the ray-transmission direction "D," the shading performance of this embodiment of the present adjustable photo-mask is shown in FIG. 4c, and the open area ratios of all the processed fibers "F" are the same and defined as a "first open area ratio."

Figure 5A:
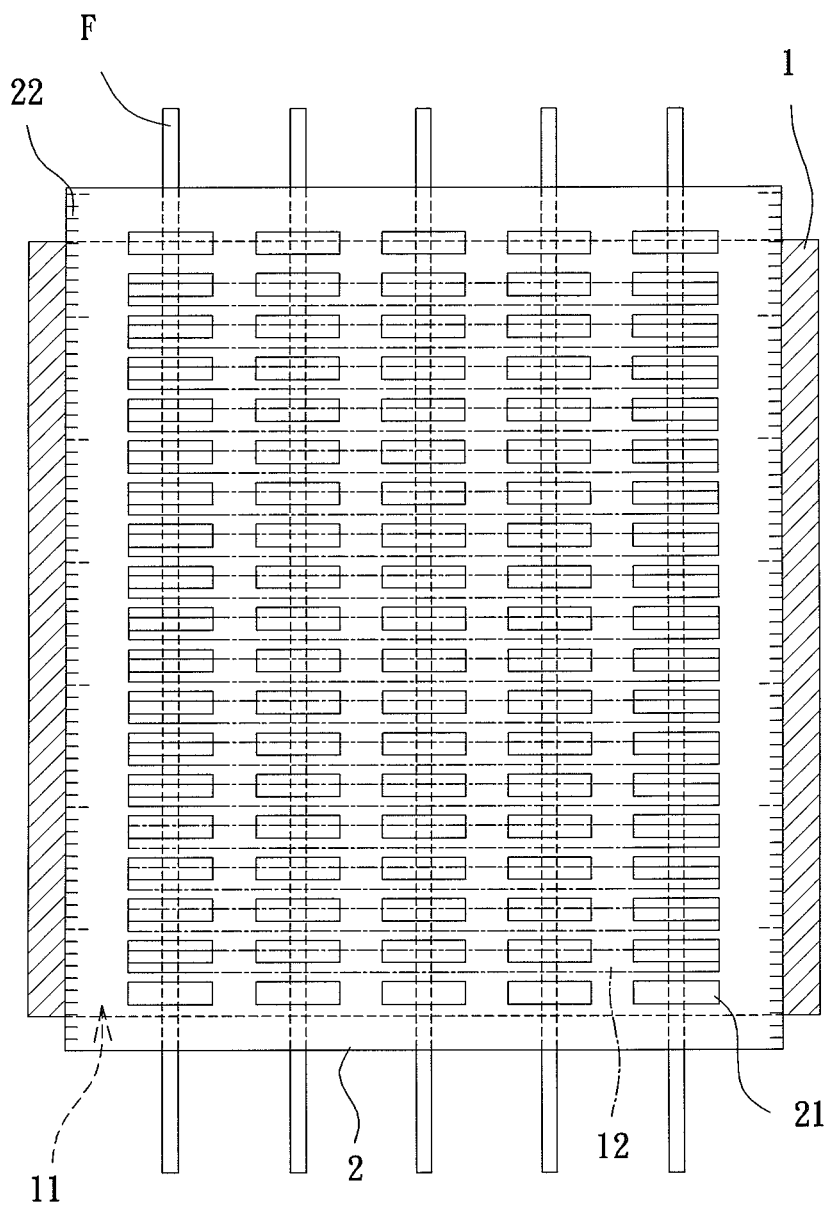
FIG. 5a is a top view of the adjustable photo-mask according to the first embodiment in a second use mode.
Figure 5B:
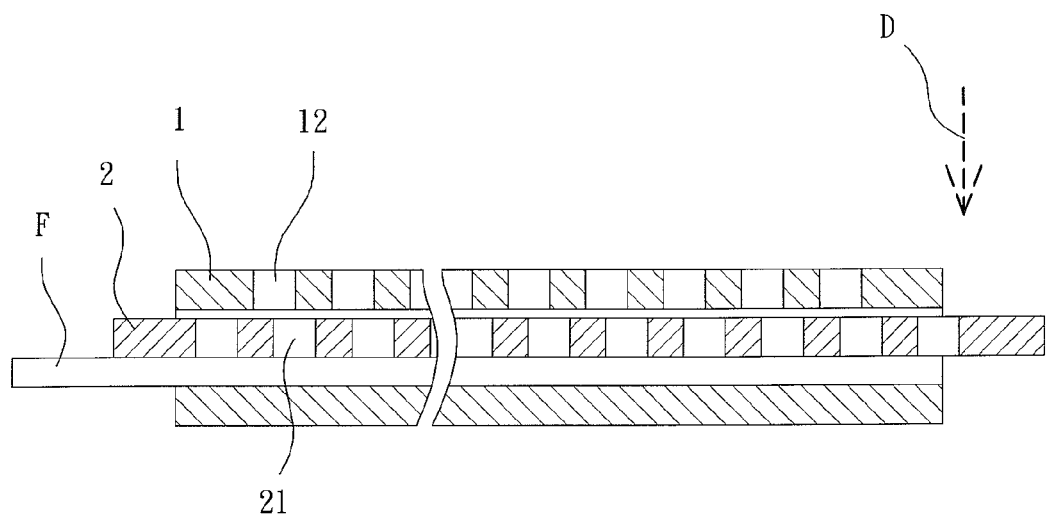
FIG. 5b is a cross-sectional view of the adjustable photo-mask according to the first embodiment in the second use mode.
Figure 5C:
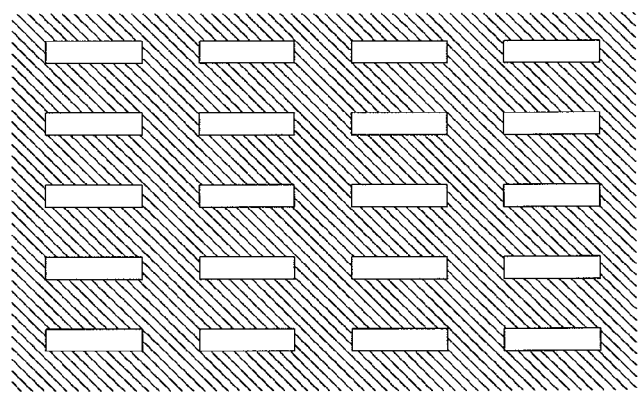
FIG. 5c is a top view of a shading performance of the adjustable photo-mask according to the first embodiment in the second use mode.

Referring to FIGS. 3 and 5a through 5c, in a "second use mode" with the plate 2 in another position for the plural through holes 21 and the openings 12 to partially overlap in the ray-transmission direction "D," the shading performance of this embodiment of the present adjustable photo-mask is shown in FIG. 5c, and the open area ratios of all the processed fibers "F" are the same and defined as a "second open area ratio." Therefore, it is apparent that the second open area ratio is smaller than the first open area ratio; namely, the width of any unexposed region in the longitudinal direction, which is formed by the second use mode, is larger than that farmed by the first use mode. Accordingly, by adjusting the degree of overlapping of the through holes 21 and the openings 12, the open area ratio of the embodiment of the present invention is changeable, and, therefore, a lower cost in manufacture is achieved.

Figure 6A:
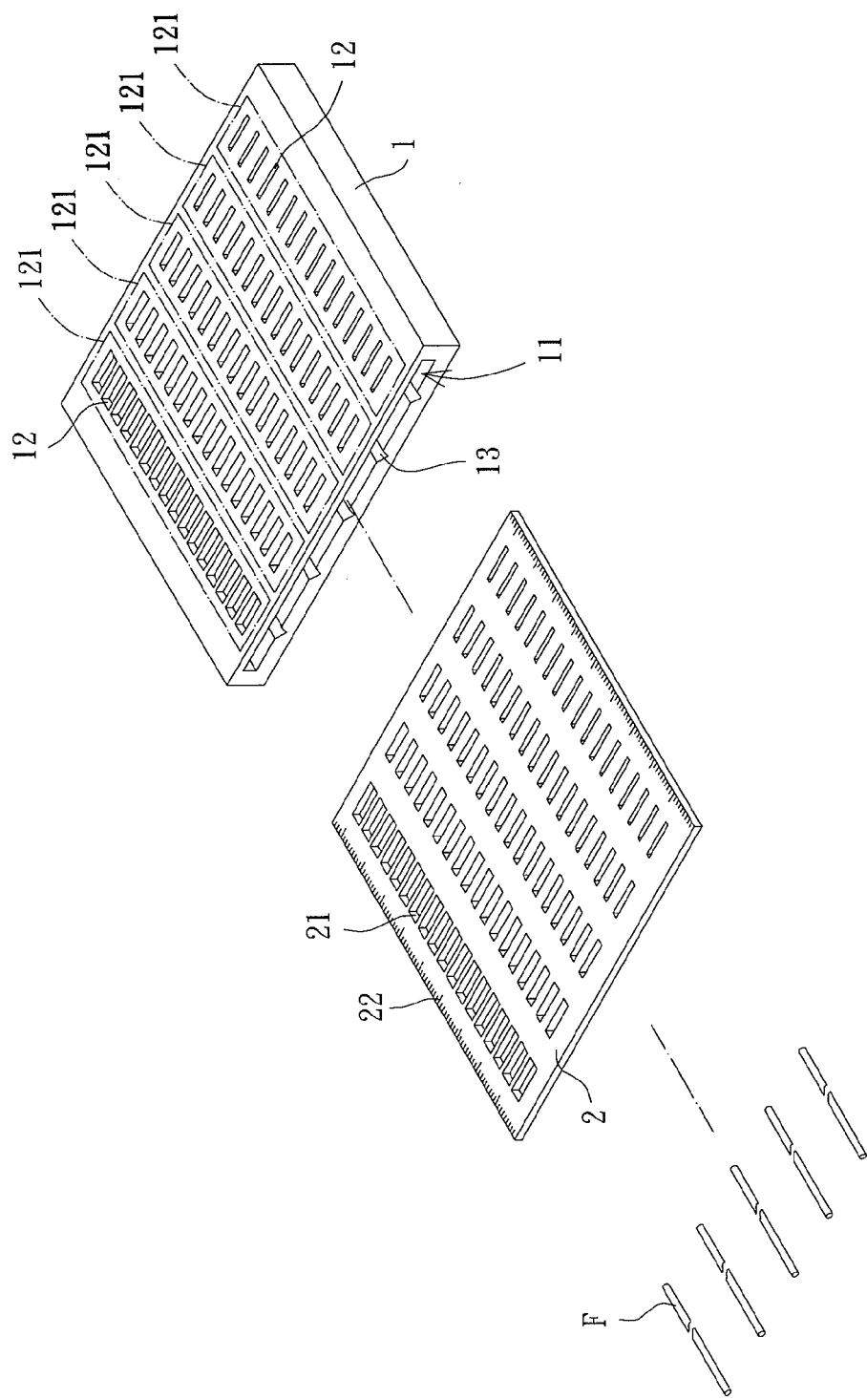
FIG. 6a is a perspective and exploded view of the adjustable photo-mask according to the first embodiment with various opening-widths in plural groups.
Figure 6B:
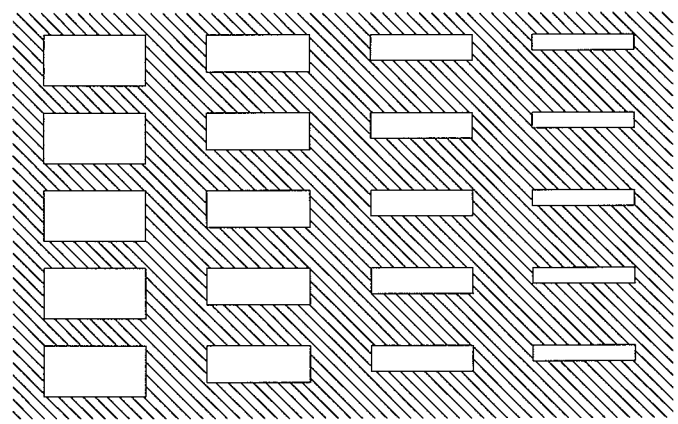
FIG. 6b is a top view of a shading performance of the adjustable photo-mask according to the first embodiment with various opening-widths in plural groups.

Referring to FIGS. 6a and 6b, another example of the casing 1 of the first embodiment is shown, by which a plurality of fibers "F" is processed at the same time and the open area ratios of the fibers "F" are different. For example, the openings 12 in different groups 121 are different in size or shape, such as the width in the longitudinal direction of the openings 12 in a first group is larger than that of the openings 12 in a second group but smaller than that of the openings 12 in a third group. Preferably, the through holes 21 are correspondingly arranged in the same way and able to align with the openings 12 in the ray-transmission direction "D," so that the openings 12 and the through holes 21 arranged in the above way can produce plural fibers with different open area ratios in a single etching procedure.

Figure 7A:
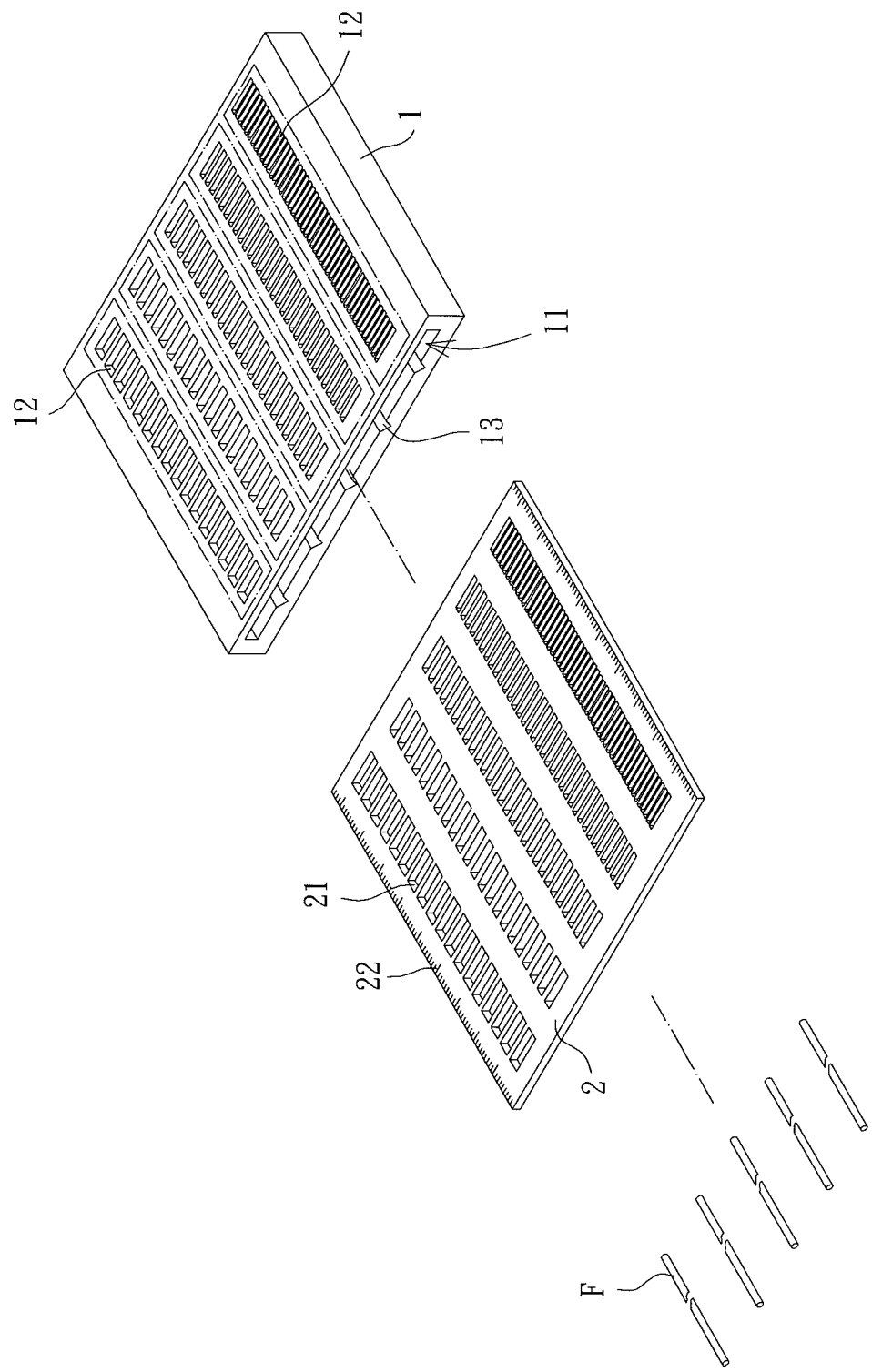
FIG. 7a is a perspective and exploded view of the adjustable photo-mask according to the first embodiment with various cycle lengths in plural groups.
Figure 7B:
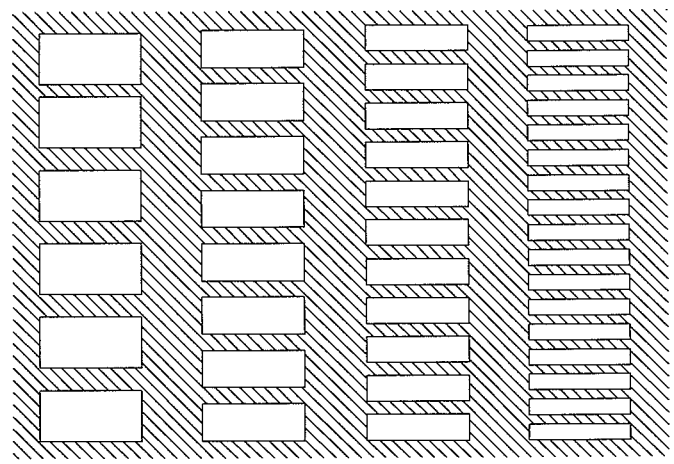
FIG. 7b is a top view of a shading performance of the adjustable photo-mask according to the first embodiment with various cycle lengths in plural groups.

Referring to FIG. 7a, another example of the casing 1 of the first embodiment is shown. In comparison with the above example shown in FIG. 6a, the groups 121 have different cycle lengths in this example, to obtain a shading performance shown in FIG. 7b. Accordingly, the openings 12 and the through holes 21 arranged in this way can produce plural fibers with different open area ratios and cycle lengths in a single etching procedure.

Figure 8:
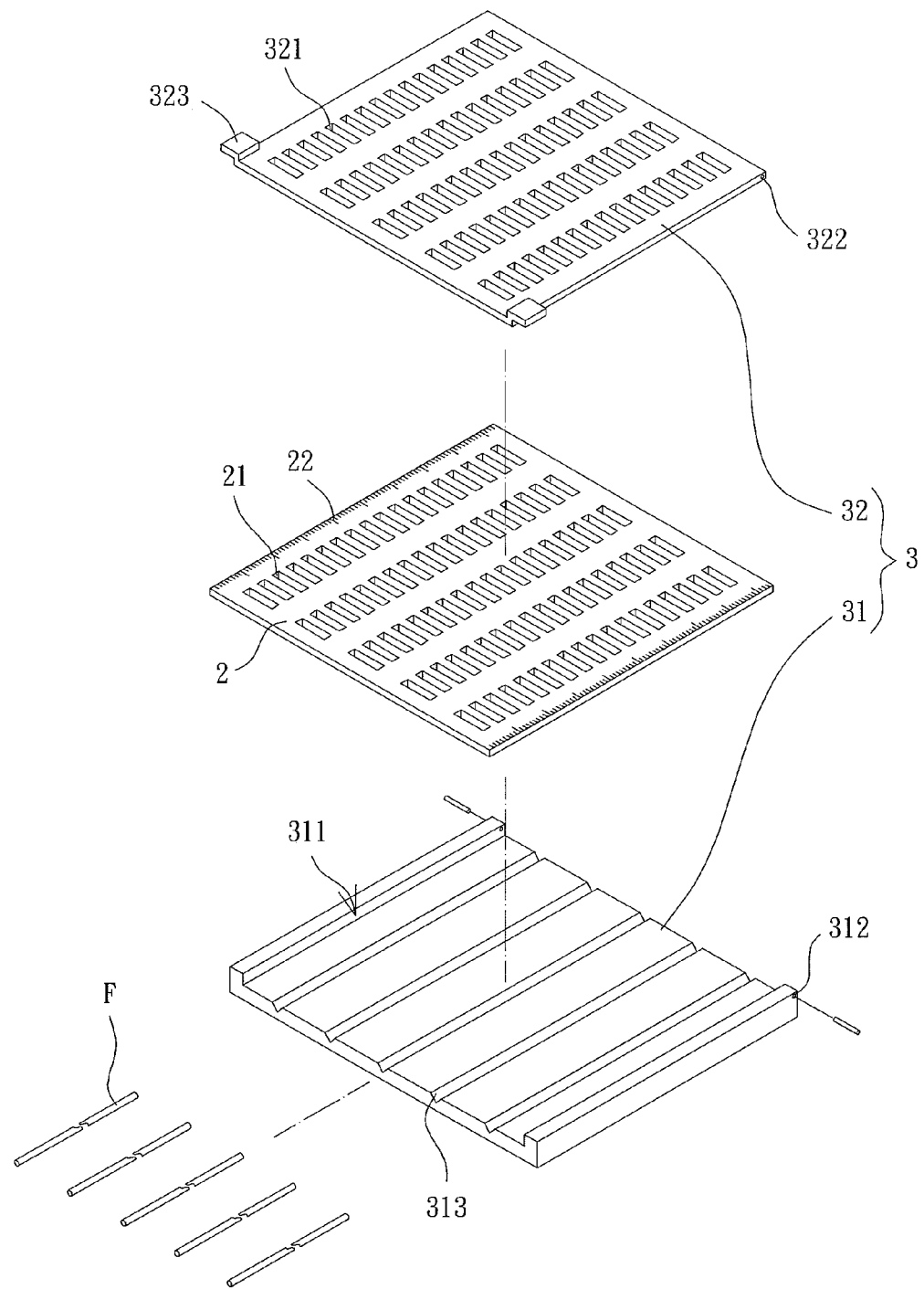
FIG. 8 is a perspective and exploded view of an adjustable photo-mask according to a second embodiment of the invention.
Figure 9:
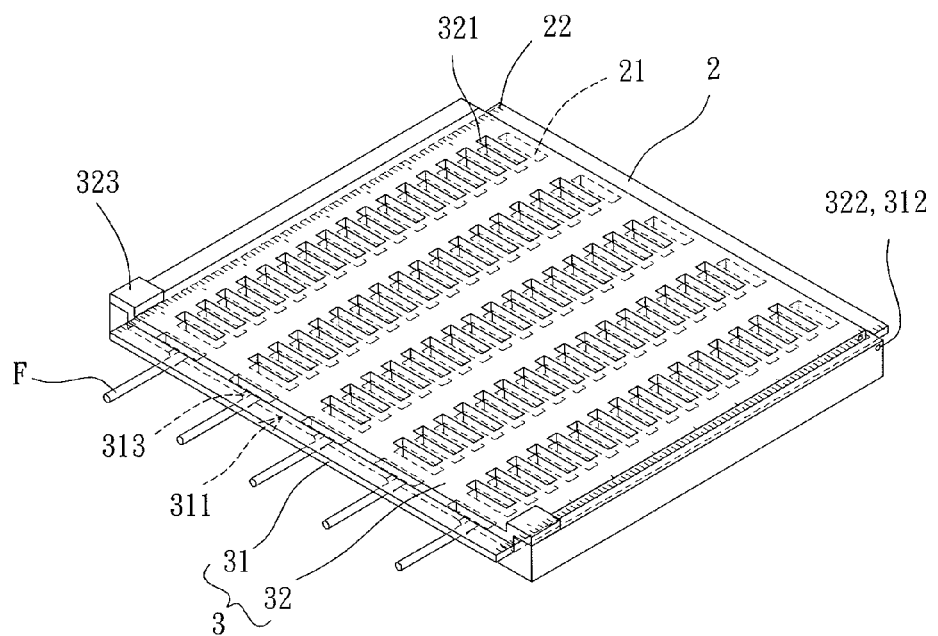
FIG. 9 is a perspective view of the adjustable photo-mask according to the second embodiment of the invention when a depression is covered.
Figure 10A:
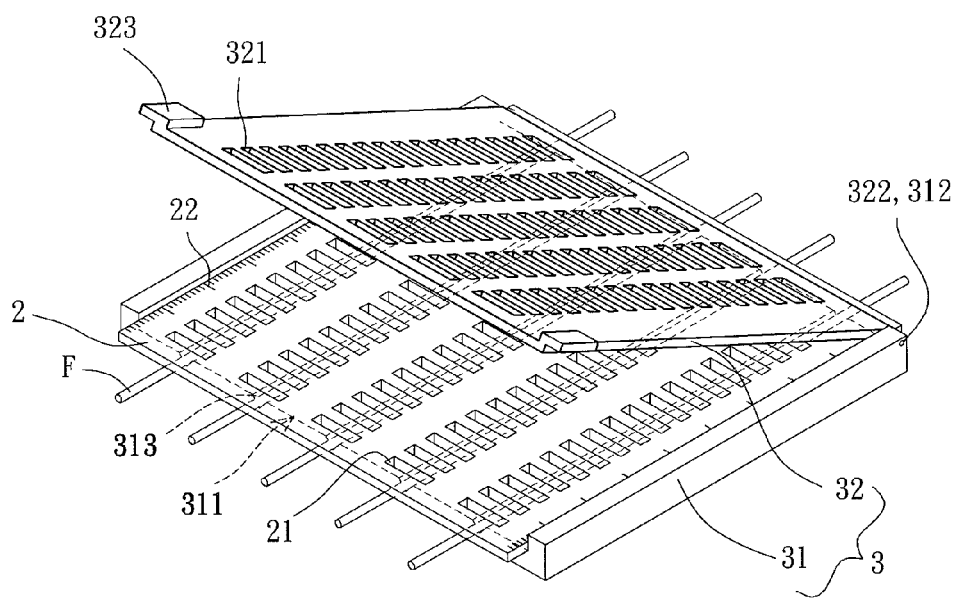
FIG. 10a is a perspective view of the adjustable photo-mask according to the second embodiment of the invention when the depression is revealed.

Please refer to FIGS. 8, 9 and 10a, which show a second embodiment of the present invention. In comparison with the casing 1 of the first embodiment, a casing 3 utilized in this embodiment includes a base 31 and a cover 32, while the plate 2 is received in the casing 3 and between the base 31 and the cover 32. The base 31 has a depression 311 and a first coupling member 312, with the depression 311 forming two opposite passages on two lateral sides of the base 31 respectively, and with the lateral sides spaced in a longitudinal direction. The first coupling member 312 is formed on one of the two lateral sides of the base 31. Furthermore, there is at least one positioning portion 313 of the base 31 formed in an inner-bottom surface of the depression 311 for the fibers "F" to be firmly fixed in predetermined positions in the depression 311 thereby, to ensure that the etching process toward the fibers "F" can be accurately performed on predetermined positions. Besides, in order to have a desirable efficiency in manufacture, the number of the at least one positioning portion 313 is plural for a plurality of fibers "F" to pass through the depression 311 in the longitudinal direction and to be etched at the same time.

The cover 32 includes a plurality of openings 321 extending from a front face to a rear face facing said inner-bottom surface of the depression 311. The cover 32 further has a second coupling member 322 at a side, which is able to rotatably couple with the first coupling member 312 of the base 31 for the cover 32 to be rotated relatively to the base 31 for covering the depression 311 as shown in FIG. 9 or revealing the depression 311 as shown in FIG. 10a. It should be noticed that the combination between the first and second coupling members 312, 322 is in a way able to firmly fix an inclination of the cover 32 relative to the base 31. Additionally, there can be at least one limit member 323 on the cover 32, which is preferably a pair of limit ears extending outwards from opposite fringes of the cover 32. Accordingly, the at least one limit member 323 is able to rest on the top of the base 31 for keeping the cover 32 in a predetermined position relative to the base 31 when the depression 311 is concealed by the cover 32, to prevent the cover 32 from interfering the movement of the plate 2 between the base 31 and the cover 32.

Figure 10B:
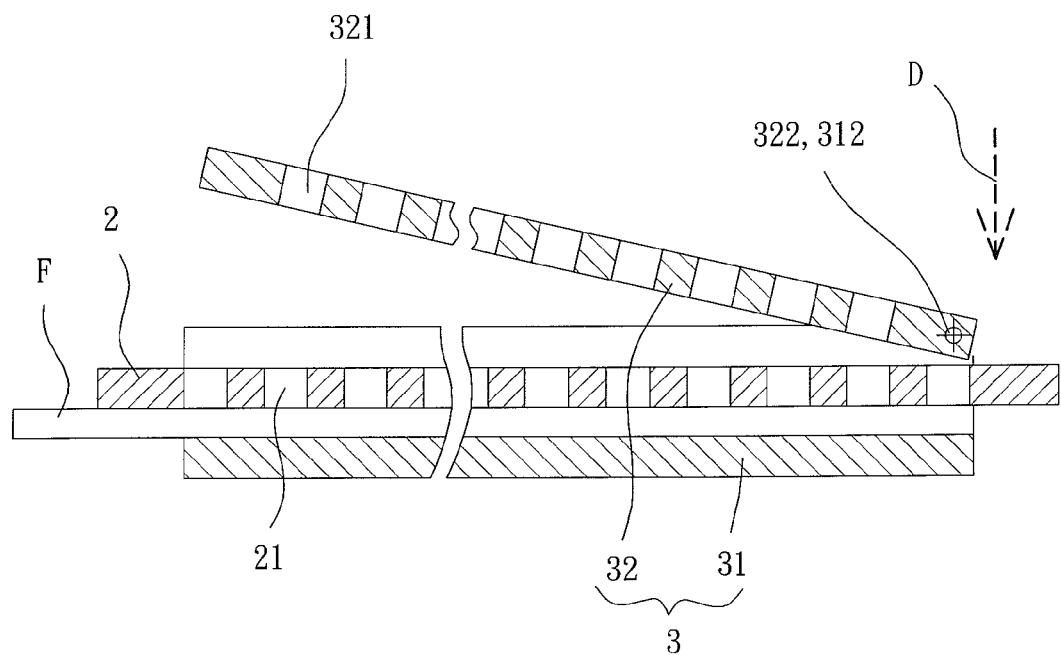
FIG. 10b is a cross-sectional view of the adjustable photo-mask according to the second embodiment of the invention when the depression is revealed.
Figure 10C:
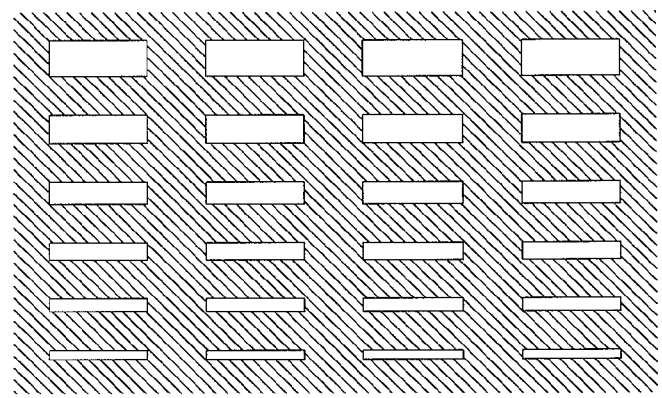
FIG. 10c is a top view of a shading performance of the adjustable photo-mask according to the second embodiment of the invention when the depression is revealed.

Referring to FIG. 9 again, the second embodiment of the present invention can be operated in the same way of the first embodiment when the cover 32 covers the depression 311. However, referring to FIGS. 10a through 10c, when the cover 32 is rotated about the first coupling member 312 to a position inclined to the plate 2, the overlaps between the openings 321 and the through holes 21 in the ray-transmission direction D vary from one of the lateral sides to the other one of them, since distances from the plural openings 321 to the plate 2 are different although the sizes of the openings 321 are the same. Accordingly, the second embodiment of the present invention can also produce plural fibers with different open area ratios and cycle lengths in a single etching procedure.

Figure 11:
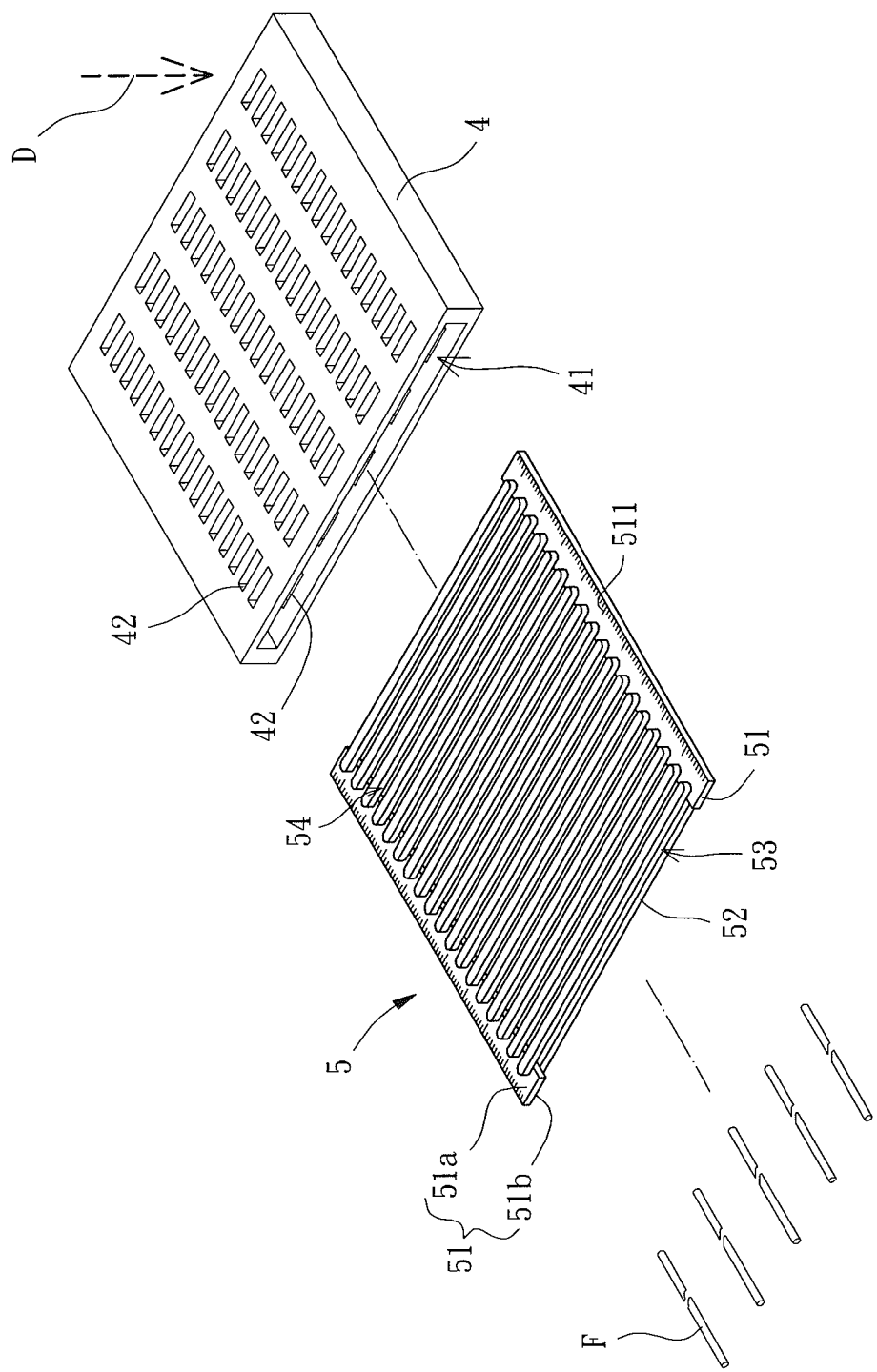
FIG. 11 is a perspective and exploded view of an adjustable photo-mask according to a third embodiment of the invention.

Referring to FIG. 11, a third embodiment of the present invention is shown, which is able to provide a two-way etching function. In this embodiment, the adjustable photo-mask includes a casing 4 and a plate 5. The casing 4 is hollow and thus has a receiving room 41 for receiving the plate 5. Preferably, the receiving room 41 respectively forms two opposite passages on two lateral sides of the casing 4, with the lateral sides spaced in a longitudinal direction, for the plate 5 to freely slide in the longitudinal direction relatively to the casing 4. The casing 4 further includes a plurality of openings 42. A part of the openings 42 extends from the receiving room 41 to a first face, and the other part of the openings 42 extend from the receiving room 41 to a second face substantially opposite to the first face. Both of the first and second faces are formed between the two lateral sides. In this embodiment, a ray-transmission direction "D" is also defined, and said ray-transmission direction "D" is the same with an axial direction of the openings 42. Therefore, rays illustrating onto the first and second faces can enter the receiving room 41 by passing through the openings 42. Therefore, rays illustrate onto the first and second faces can enter the receiving room 41 by passing through the openings 42.

In this third embodiment, the plate 5 includes two side frames 51 and a plurality of shading bars 52. The side frames 51 are arranged in a parallel way. Each side frame 51 has a first surface 51a and a second surface 51b, and at least one of the side frames 51 has scales 511 on the first and second surfaces 51a, 51b for showing the position relationship between the plate 5 and the casing 4 and for immediately determining the amount of slide of the plate 5. A part of the shading bars 52 links the first surfaces 51a of the two side frames 51, and the other part of the shading bars 52 links the second surfaces 51b of the two side frames 51. Thus, an insertion space 53 is formed between the two parts of the shading bars 52 by the thickness of the side frames 51 for at least one fiber "F" to extend therein. Specifically, the shading bars 52 on the same side of the side frames 51 are spaced to form a through hole 54 between any adjacent two of the shading bars 52, while the through holes 54 formed by the shading bars 52 communicate with the insertion space 53.

Figure 12:
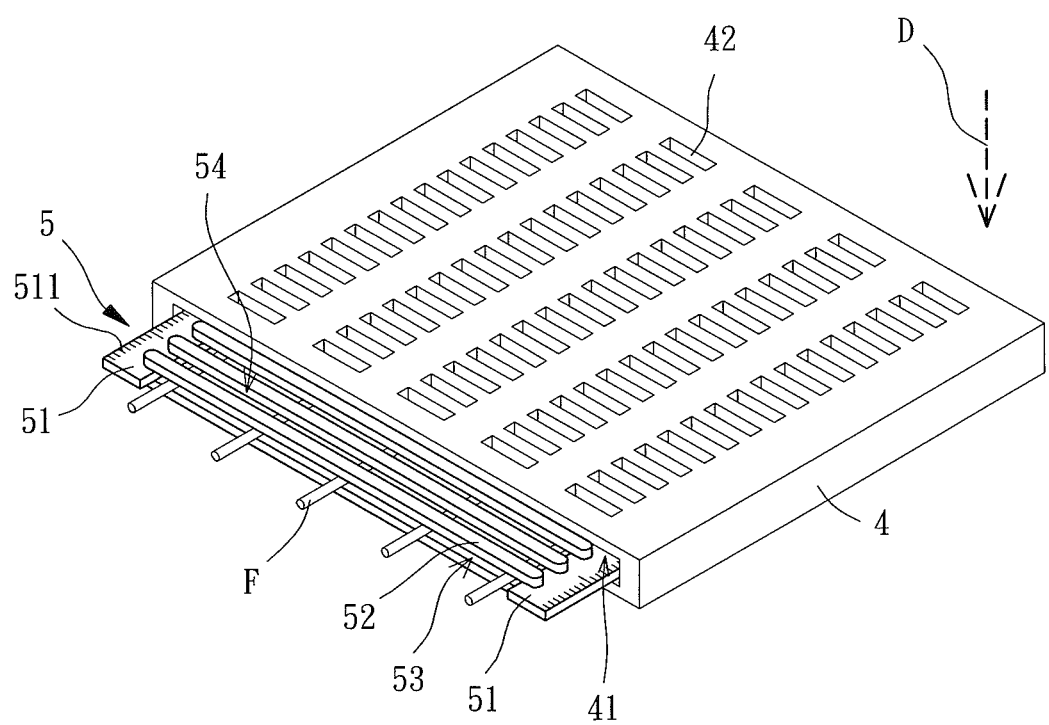
FIG. 12 is a perspective view of the adjustable photo-mask according to the third embodiment of the invention in use.

Please refer to FIG. 12 now. Before an etching process starts, the plate 5 is received in the receiving room 41 of the casing 4, and the fibers "F" going to be etched are inserted in the insertion space 53 of the plate 5. During the etching process, rays transmit in the ray-transmission direction "D" and enter the insertion space 53 via the openings 42 and the through holes 54. Particularly, with the above described structure of the third embodiment, rays illuminate the casing 4 on both of the first and second faces to perform a two-way etching on the fibers "F." Alternatively, even though the machine providing the rays can only produce one-way rays, the whole of the adjustable photo-mask and the fibers "F" therein can be reversed for etching a side of each fiber "F" after the other side of each fiber "F" has been etched. Therefore, the adjustable photo-mask not only is able to improve the execution efficiency of the two-way etching process, but also can maintain a precise etching performance toward the fibers "F."

Figure 13:
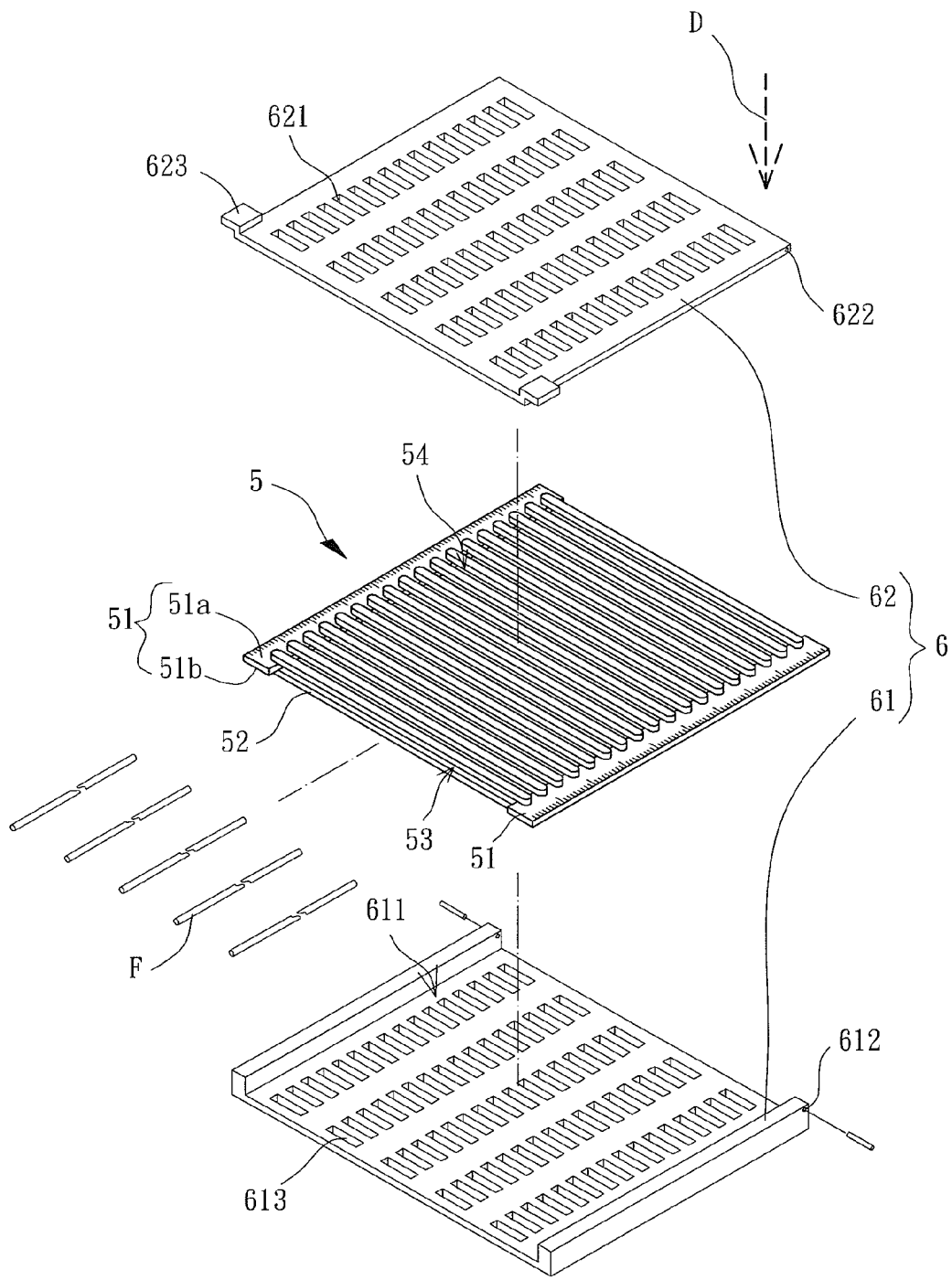
FIG. 13 is a perspective and exploded view of an adjustable photo-mask according to a fourth embodiment of the invention.

Referring to FIG. 13, a fourth embodiment of the present invention is shown, with the adjustable photo-mask of this embodiment having a casing 6 and the plate 5 described in the previous embodiment. In this embodiment, the casing 6 includes a base 61 and a cover 62, while the plate 5 is received in the casing 6 and between the base 61 and the cover 62. The base 61 has a depression 611 and a first coupling member 612. The depression 611 forms two opposite passages on two lateral sides of the base 61 respectively, with the lateral sides spaced in a longitudinal direction. The first coupling member 612 is formed on one of the two lateral sides of the base 61. Furthermore, there is a plurality of openings 613 extending from an outer-bottom surface of the base 61 to the depression 311 for rays illustrated onto the outer bottom surface to enter the depression 311 via the openings 613. Moreover, an axial direction of the openings 613 is defined as a ray-transmission direction "D."

The cover 62 includes a plurality of openings 621 extending from a front face to a rear face facing said inner-bottom surface of the depression 611. The cover 62 further has a second coupling member 622 at a side, which is able to rotatably couple with the first coupling member 612 of the base 61 for the cover 62 to be rotated relatively to the base 61 for covering the depression 611 or revealing the depression 611. Additionally, there can be at least one limit member 623 on the cover 62, which is preferably a pair of limit ears extending outwards from opposite fringes of the cover 62. Accordingly, the at least one limit member 623 is able to rest on the to of the base 61 for keeping the cover 62 in a predetermined position relative to the base 61 when the depression 611 is concealed by the cover 62, to prevent the cover 62 from interfering the movement of the plate 5 between the base 61 and the cover 62. Structures and operations about the rotatable cover 62 are similar to those of the cover 32 of the casing 3 of the second embodiment and thus are not further illustrated.

With the above structure, the overlaps between the openings 621 and the through holes 54 in the ray-transmission direction "D" can be adjusted by shifting the plate 5 relatively to the casing 6 longitudinally or by rotating the cover 62 relatively to the base 61, to change the shading performance of this fourth embodiment. Accordingly, the fourth embodiment of the present invention can also produce plural fibers with different open area ratios and cycle lengths in a single etching procedure. Besides, the openings 613 in the base 61 also make a two-way etching function possible.

Figure 14:
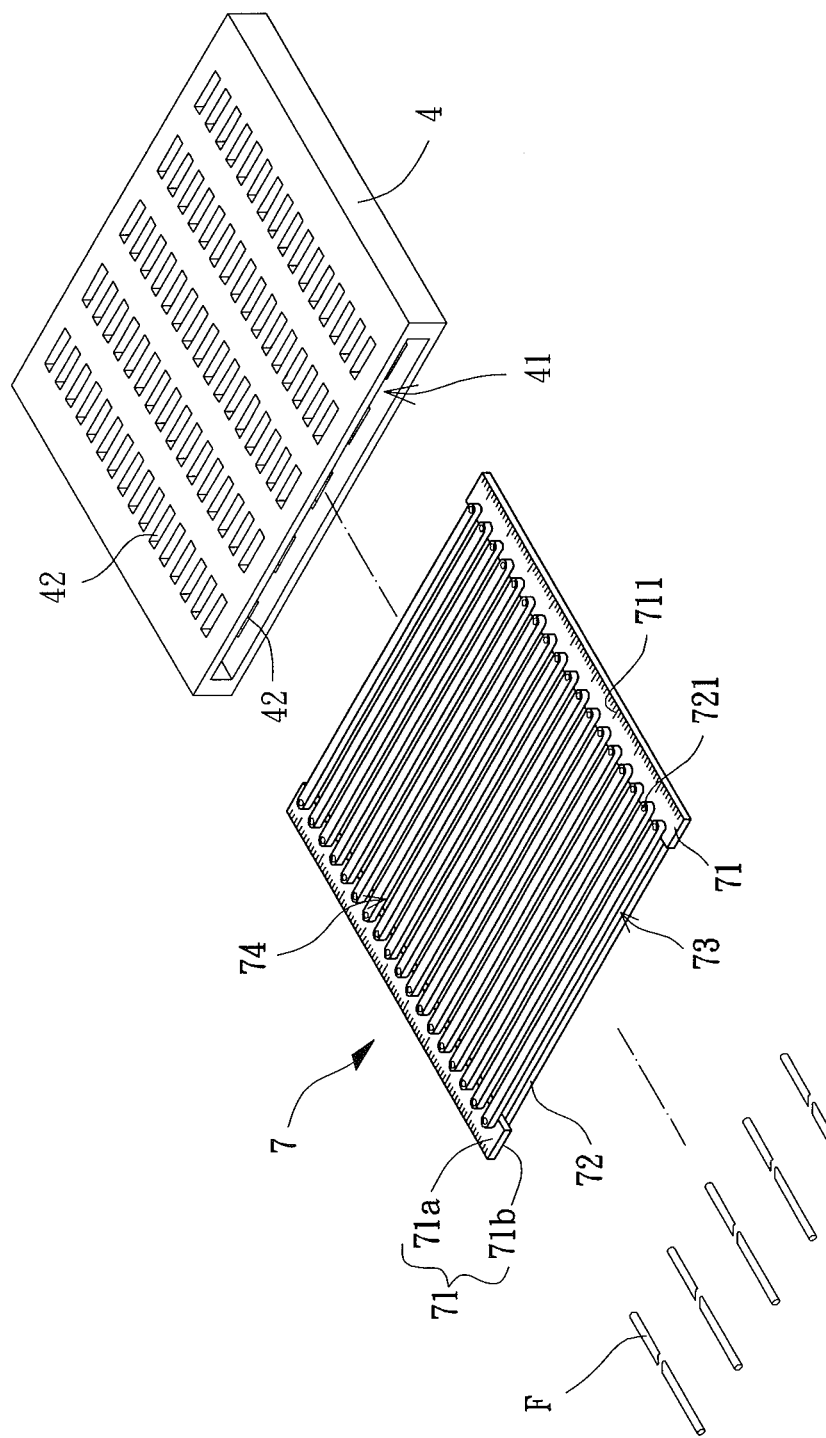
FIG. 14 is a perspective and exploded view of an adjustable photo-mask according to a fifth embodiment of the invention.

Referring to FIG. 14, a fifth embodiment of the present invention is shown, with the adjustable photo-mask of this embodiment having the casing 4 used in the third embodiment and a plate 7. The plate 7 includes two side frames 71 and a plurality of shading bars 72. The side frames 71 are arranged in a parallel way. Each side frame 71 has a first surface 71a and a second surface 71b, and at least one of the side frames 71 has a scale 711 on each of the first and second surfaces 71a, 71b for showing the position relationship between the plate 7 and the casing 4 and for immediately determining the amount of slide of the plate 7. Each shading bar 72 has two pivotal members 721 respectively forming two ends thereof A part of the shading bars 72 rotatably links the first surfaces 71a of the two side frames 71 via the pivotal members 721 thereof, and the other part of the shading bars 72 rotatably links the second surfaces 71b of the two side frames 71 via the pivotal members 721 thereof. Thus, an insertion space 73 is formed between the two parts of the shading bars 72 by the thickness of the side frames 71 for at least one fiber "F" to extend therein. Specifically, the shading bars 72 on the same side of the side frames 71 are spaced to form a through hole 74 between any adjacent two of the shading bars 72, while the through holes 74 formed by the shading bars 72 communicate with the insertion space 73.

Figure 15A:
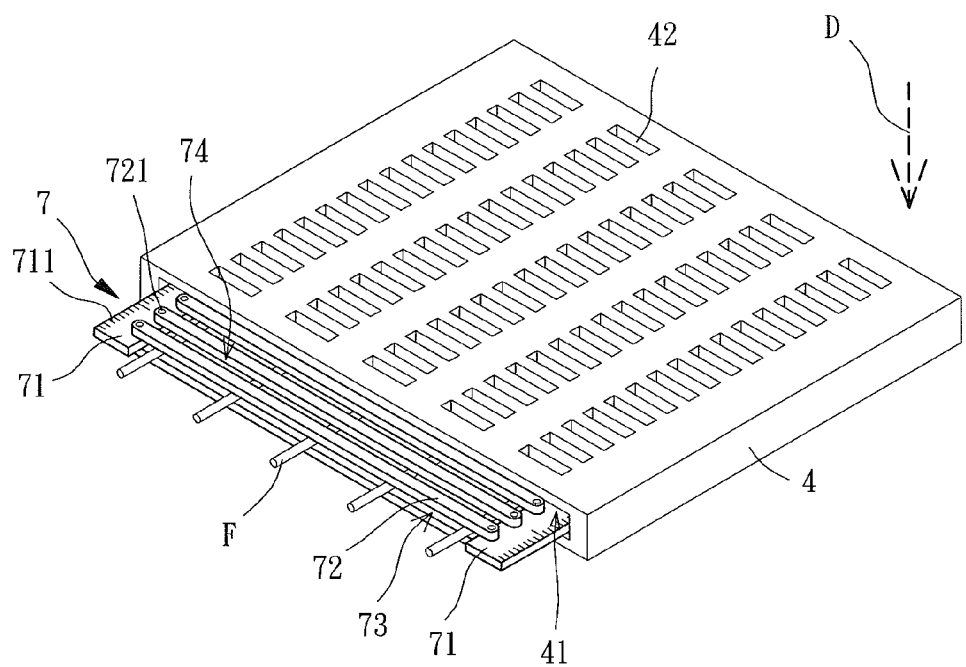
FIG. 15a is a perspective view of the adjustable photo-mask according to the fifth embodiment of the invention with the adjustable photo-mask in a first type.
Figure 15B:
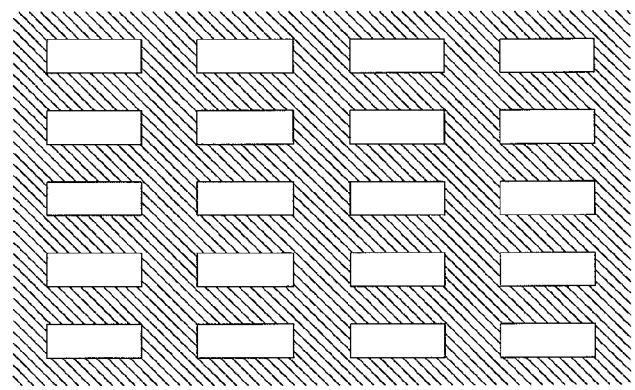
FIG. 15b is a top view of a shading performance of the adjustable photo-mask according to the fifth embodiment of the invention with the adjustable photo-mask in the first type.
Figure 16A:
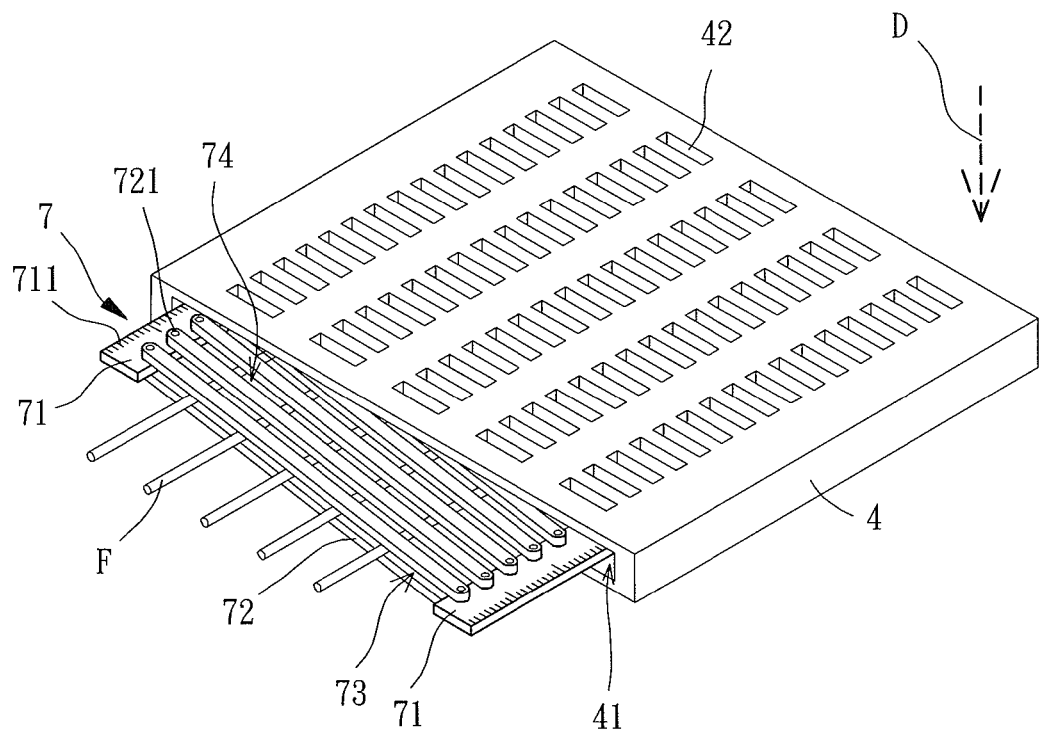
FIG. 16a is a perspective view of the adjustable photo-mask according to the fifth embodiment of the invention with the adjustable photo-mask in a second type.
Figure 16B:
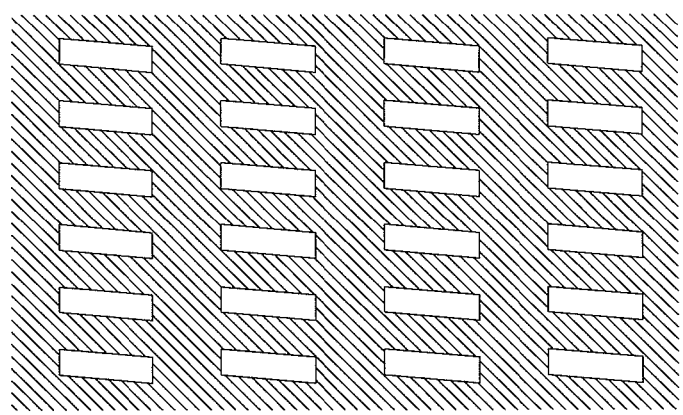
FIG. 16b is a top view of a shading performance of the adjustable photo-mask according to the fifth embodiment of the invention with the adjustable photo-mask in the second type.

Before an etching process starts, the plate 7 is received in the receiving room 41 of the casing 4, and the fibers "F" going to be etched are inserted in the insertion space 73 of the plate 7. Moreover, referring to FIGS. 15a and 15b, extending directions of each shading bar 72 and any one of the side frames 71 can be perpendicular to each other, to form a shading performance as shown in FIG. 15b. However, referring to FIGS. 16a and 16b, extending directions of each shading bar 72 and any one of the side frames 71 can also be inclined to each other, to form a shading performance as shown in FIG. 16b, which provides a cycle length or an open area ratio different from that of the shading performance shown in FIG. 15b.

In sum, the adjustable photo-mask can be completed by any one of the casings 1, 3, 4, 6 and any one of the plates 2, 5, 7, to achieve convenient changes in the cycle length and open area ratio without using any other photo-mask, and the provided adjustable photo-mask is even suitable for a two-way etching process if the casings 4, 6 are used.

Although the invention has been described in detail with reference to its presently preferable embodiments, it will be understood by one of ordinary skill in the art that various modifications can be made without departing from the spirit and the scope of the invention, as set forth in the appended claims.

What is claimed is:

1. An adjustable photo-mask comprising:
   a casing having a base and a cover, wherein both of the base and the cover have a plurality of openings penetrating the base or the cover, wherein an axial direction of the openings of the base is defined as a ray-transmission direction, wherein the base further has a depression and a first coupling member, and wherein the cover further has a second coupling member rotatably coupling with the first coupling member for the cover to cover the depression or to reveal the depression; and
   a plate having two side frames and a plurality of shading bars, wherein the two side frames are arranged in parallel, wherein each of the two side frames has a first surface and a second surface, wherein a part of the plurality of shading bars links the first surfaces of the two side frames and another part of the plurality of shading bars links the second surfaces of the two side frames to form an insertion space between the parts of the plurality of shading bars, wherein the plurality of shading bars arranged on a same side of the two side frames are spaced to form a through hole between any adjacent two of the plurality of shading bars and communicating with the insertion space, wherein the plate is slideably received in the receiving room, and wherein the through holes and the plurality of openings totally or partially overlap in the ray-transmission direction.

2. The adjustable photo-mask as claimed in claim 1, wherein the depression forms two opposite passages on two lateral sides of the base respectively, wherein the first coupling member is formed on one of the two lateral sides of the base, and wherein the first coupling member is formed at a side of the cover.

3. The adjustable photo-mask as claimed in claim 1, wherein the cover has at least one limit member resting on a top of the base.

4. The adjustable photo-mask as claimed in claim 1, wherein at least one of the two side frames has scales on the first and second surfaces.

5. The adjustable photo-mask as claimed in claim 1, wherein each of the plurality of shading bars has two pivotal members respectively forming two ends thereof, wherein the part of the plurality of shading bars rotatably links the first surfaces of the two side frames via the two pivotal members thereof, and wherein the other part of the plurality of shading bars rotatably links the second surfaces of the two side frames via the two pivotal members thereof.

\* \* \* \* \*